(12) United States Patent
Bhuiyan (10) Patent No.: US 8,803,550 B2
(45) Date of Patent: Aug. 12, 2014

(54) DYNAMIC HIGH SPEED BUFFER WITH WIDE INPUT NOISE MARGIN

(71) Applicant: SanDisk Technologies Inc., Plano, TX (US)

(72) Inventor: Ekram H. Bhuiyan, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 82 days.

(21) Appl. No.: 13/712,467

(22) Filed: Dec. 12, 2012

(65) Prior Publication Data

US 2014/0159774 A1    Jun. 12, 2014

(51) Int. Cl.
*H03K 17/16* (2006.01)
*G01R 25/00* (2006.01)
*H03K 19/0175* (2006.01)

(52) U.S. Cl.
CPC .............. *H03K 19/017509* (2013.01)
USPC .................. 326/22; 326/26; 326/29; 327/12; 327/34

(58) Field of Classification Search
USPC .......... 326/21, 22, 26, 29, 82, 83; 327/12, 34, 327/74, 153, 199, 205, 558
See application file for complete search history.

(56) References Cited

U.S. PATENT DOCUMENTS

| 4,807,198 | A | 2/1989 | Flannagan et al. |
|---|---|---|---|
| 5,487,038 | A | 1/1996 | Komarek et al. |
| 6,407,608 | B1 | 6/2002 | Brown et al. |
| 6,456,141 | B1 | 9/2002 | Nishizono et al. |
| 6,507,221 | B2 * | 1/2003 | La Rosa ........................... 327/34 |
| 6,965,251 | B1 * | 11/2005 | Tran et al. ........................ 326/33 |
| 6,970,032 | B1 * | 11/2005 | Smith et al. .................... 327/407 |
| 7,023,238 | B1 | 4/2006 | Camarota |
| 7,221,199 | B2 * | 5/2007 | Chung ........................... 327/143 |
| 7,276,935 | B1 | 10/2007 | Camarota |
| 7,279,948 | B2 * | 10/2007 | Kozawa ......................... 327/205 |
| 7,423,456 | B2 * | 9/2008 | Gomm et al. .................... 327/12 |
| 8,289,755 | B1 * | 10/2012 | Rahim et al. ................... 365/156 |
| 8,466,634 | B2 * | 6/2013 | Godbole ........................ 315/307 |

* cited by examiner

*Primary Examiner* — Vibol Tan
(74) *Attorney, Agent, or Firm* — Weaver Austin Villeneuve & Sampson LLP (57) ABSTRACT

This disclosure provides examples of circuits, devices, systems, and methods for providing high speed operation and a high noise margin. In one implementation, a circuit includes a first buffer configured to receive an incoming signal and a control signal and to generate an output signal based on the incoming signal. The first buffer exhibits a first hysteresis range while configured in a first hysteresis state and a second hysteresis range while configured in a second hysteresis state. The first buffer is configured to transition from the first to the second hysteresis state and vice versa in response to the control signal. The circuit includes a second buffer configured to receive the incoming signal and to generate the control signal based on the incoming signal. The second buffer exhibits a third hysteresis range with a lower threshold and an upper threshold.

20 Claims, 9 Drawing Sheets

DYNAMIC HIGH SPEED BUFFER WITH WIDE INPUT NOISE MARGIN

TECHNICAL FIELD

This disclosure relates generally to input/output (I/O) circuits, and more specifically, to buffers that achieve both high speed operation as well as a high degree of noise immunity.

DESCRIPTION OF THE RELATED TECHNOLOGY

I/O circuits such as input buffers are utilized in a variety of devices and systems. For example, I/O circuits and input buffers can be used in a variety of nonvolatile memory systems and for a variety of applications. Some nonvolatile memory systems are embedded in a larger system such as a personal computer, for example, as a Solid State Drive (SSD). Other removable nonvolatile memory systems are connected to a host system and may be interchanged between different host systems. Examples of nonvolatile memory systems include memory cards, USB flash drives, and removable SSDs. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. Memory card standards include PC Card, CompactFlash™ card (CF™ card), SmartMedia™ card, MultiMediaCard (MMC™), Secure Digital (SD) card, miniSD™ card, Subscriber Identity Module (SIM), Memory Stick™, Memory Stick Duo card and microSD/TransFlash™ memory module standards.

SUMMARY

This disclosure provides examples of circuits, devices, systems, and methods for providing high speed operation with high noise immunity. In some implementations, a circuit includes a first buffer configured to receive an incoming signal and a control signal and to generate an output signal based on the incoming signal. The first buffer exhibits a first hysteresis range while configured in a first hysteresis state and exhibits a second hysteresis range while configured in a second hysteresis state. The first buffer is configured to transition from the first hysteresis state to the second hysteresis state and vice versa in response to the control signal. The circuit further includes a second buffer configured to receive the incoming signal and to generate the control signal based on the incoming signal. The second buffer exhibits a third hysteresis range with a lower threshold more negative than at least a lower threshold of the second hysteresis range, and an upper threshold more positive than at least an upper threshold of the first hysteresis range.

In some implementations, the third hysteresis range is symmetric about a central value but neither the first hysteresis range nor the second hysteresis range is symmetric about the central value. In some implementations, while in the first hysteresis state, the first hysteresis range is skewed to a relatively more negative set of upper and lower threshold values, and while in the second hysteresis state, the second hysteresis range is skewed to a relatively more positive set of upper and lower threshold values.

In some implementations, from a state in which the incoming signal is low, the output signal is in a first logic state, the control signal is in a second logic state, and the first buffer is in the first hysteresis state: when the incoming signal rises above the upper threshold of the first buffer, the first buffer transitions the output signal to a third logic state. When the incoming signal rises above the upper threshold of the second buffer, the second buffer transitions the control signal to a fourth logic state, and the first buffer transitions from the first hysteresis state to the second hysteresis state based on the fourth logic state.

In some implementations, from a state in which the incoming signal is high, the output signal is in the third logic state, the control signal is in the fourth logic state, and the first buffer is in the second hysteresis state: when the incoming signal falls below the lower threshold of the first buffer, the first buffer transitions the output signal to the first logic state. When the incoming signal falls below the lower threshold of the second buffer, the second buffer transitions the control signal to the second logic state, and the first buffer transitions from the second hysteresis state to the first hysteresis state based on the second logic state.

In some implementations, a circuit includes a first buffer configured to receive an incoming signal and to generate a first output signal based on the incoming signal. The first buffer exhibits a first dynamic hysteresis range with a dynamic lower threshold and a dynamic upper threshold. The first buffer is configured to transition from a first hysteresis state in which the dynamic lower threshold has a first lower value and the dynamic upper threshold has a first upper value, to a second hysteresis state in which the dynamic lower threshold has a second lower value and the dynamic upper threshold has a second upper value. The circuit further includes a second buffer configured to receive the incoming signal and to generate a second output signal based on the incoming signal. The second buffer exhibits a second hysteresis range with a lower threshold and an upper threshold. The second buffer is configured to change a logic state of the second output signal when the incoming signal crosses the lower threshold or the upper threshold of the second hysteresis. The first buffer is configured to transition from the first hysteresis state to the second hysteresis state or from the second hysteresis state to the first hysteresis state in response to the logic state of the second output signal. The first buffer is configured to change a logic state of the first output signal when the incoming signal crosses the dynamic lower threshold or the dynamic upper threshold of the first hysteresis.

In some implementations, the value of the lower threshold and the value of the upper threshold of the second hysteresis range are both static during operation of the second buffer. In some implementations, the second hysteresis range is symmetric about a central value but the first hysteresis range is not symmetric about the central value while in either the first hysteresis state or the second hysteresis state. In some implementations, while in the first hysteresis state, the first dynamic hysteresis range is skewed to a relatively more negative set of upper and lower threshold values, and while in the second hysteresis state, the first dynamic hysteresis range is skewed to a relatively more positive set of upper and lower threshold values.

In some such implementations, when the first buffer is in the first hysteresis state: the first upper value of the dynamic upper threshold has a value more positive than or equal to the central value but proximate the central value relative to the value of the upper threshold of the second hysteresis range, and the first lower value of the dynamic lower threshold has a value substantially more negative than the central value. In some implementations, when the first buffer is in the second hysteresis state: the second upper value of the dynamic upper threshold has a value substantially more positive than the central value, and the second lower value of the dynamic lower threshold has a value less than or equal to the central value but proximate the central value relative to the value of the lower threshold of the second hysteresis range. In some such implementations, the offset between the first upper value of the dynamic upper threshold and the central value is less than a value that is in the range of approximately 10% to approximately 50% of the offset between the value of the upper threshold of the second hysteresis range and the central value. In some implementations, the first lower value of the dynamic lower threshold is approximately equal to the value of the lower threshold of the second hysteresis range. In some implementations, the offset between the second lower value of the dynamic lower threshold and the central value is less than a value that is in the range of approximately 10% to approximately 50% of the offset between the value of the lower threshold of the second hysteresis range and the central value. In some implementations, the second upper value of the dynamic upper threshold is approximately equal to the value of the upper threshold of the second hysteresis range. In some implementations, the value of the upper threshold of the second hysteresis range is more positive than the second upper value of the dynamic upper threshold of the first buffer, and the value of the lower threshold of the second hysteresis range is more negative than the first lower value of the dynamic lower threshold of the first buffer.

In some implementations, from a state in which the incoming signal is low, the first output signal is in a first logic state, the second output signal is in a second logic state, and the first buffer is in the first hysteresis state: when the incoming signal rises above the dynamic upper threshold of the first buffer, the first buffer transitions the first output signal to a third logic state. When the incoming signal rises above the upper threshold of the second buffer, the second buffer transitions the second output signal to a fourth logic state, and the first buffer transitions from the first hysteresis state to the second hysteresis state based on the fourth logic state. In some implementations, from a state in which the incoming signal is high, the first output signal is in the third logic state, the second output signal is in the fourth logic state, and the first buffer is in the second hysteresis state: when the incoming signal falls below the dynamic lower threshold of the first buffer, the first buffer transitions the first output signal to the first logic state. When the incoming signal falls below the lower threshold of the second buffer, the second buffer transitions the second output signal to the second logic state, and the first buffer transitions from the second hysteresis state to the first hysteresis state based on the second logic state.

In some implementations, a circuit includes a first buffer configured to receive an incoming signal and to generate a first output signal based on the incoming signal. The first buffer exhibiting a first dynamic hysteresis range with a dynamic lower threshold and a dynamic upper threshold. The first buffer is configured to transition from a first hysteresis state in which the dynamic lower threshold has a first lower value and the dynamic upper threshold has a first upper value, to a second hysteresis state in which the dynamic lower threshold has a second lower value and the dynamic upper threshold has a second upper value. The circuit further includes a second buffer configured to receive the incoming signal and to generate a second output signal based on the incoming signal. The second buffer exhibits a second hysteresis range with a lower threshold and an upper threshold. From a state in which the incoming signal is low, the first output signal is in a first logic state, the second output signal is in a second logic state, and the first buffer is in the first hysteresis state: when the incoming signal rises above the dynamic upper threshold of the first buffer, the first buffer transitions the first output signal to a third logic state. When the incoming signal rises above the upper threshold of the second buffer, the second buffer transitions the second output signal to a fourth logic state, and the first buffer transitions from the first hysteresis state to the second hysteresis state based on the fourth logic state. From a state in which the incoming signal is high, the first output signal is in the third logic state, the second output signal is in the fourth logic state, and the first buffer is in the second hysteresis state: when the incoming signal falls below the dynamic lower threshold of the first buffer, the first buffer transitions the first output signal to the first logic state. When the incoming signal falls below the lower threshold of the second buffer, the second buffer transitions the second output signal to the second logic state, and the first buffer transitions from the second hysteresis state to the first hysteresis state based on the second logic state.

BRIEF DESCRIPTION OF THE DRAWINGS

Like reference numbers and designations in the various drawings indicate like elements.

DETAILED DESCRIPTION

This disclosure provides examples of circuits, devices, systems, and methods for providing high speed operation with high noise immunity. Particular implementations described herein relate to a circuit that includes two buffers having different hysteresis. In some implementations, a first one of the buffers has a dynamic, asymmetric hysteresis while a second one of the buffers has a fixed, wide hysteresis. As will be described below, the buffers can be arranged or configured to provide for a high degree of immunity from noise in the incoming signal while maintaining high speed operation of the circuit overall.

The circuits described herein can be utilized in a variety of applications. In some implementations, the circuits described herein are used in digital electronic devices or systems. For example, in some implementations, the circuits described herein can be used in a memory device. For example, the circuits can be used in solid state memory devices such as memory cards, USB flash drives, and removable SSDs. In some implementations, the circuits can be input/output I/O circuits (or interfaces) for a controller, such as a memory controller. In some implementations, the memory controller can be used in a host interface for a memory card such as, for example, a PC Card, a CF™ card, a SmartMedia™ card, a MMC™ card, an SD card, a miniSD™ card, a SIM card, a Memory Stick™ card, a Memory Stick Duo card, a microSD/TransFlash™ card, a Compact Flash card, or an iNAND card. In some other implementations, the circuits can be used in other devices or systems. Generally, various implementations described herein can be used in any circuit in which speed and noise immunity are desired, including non-memory circuits.

Figure 1:
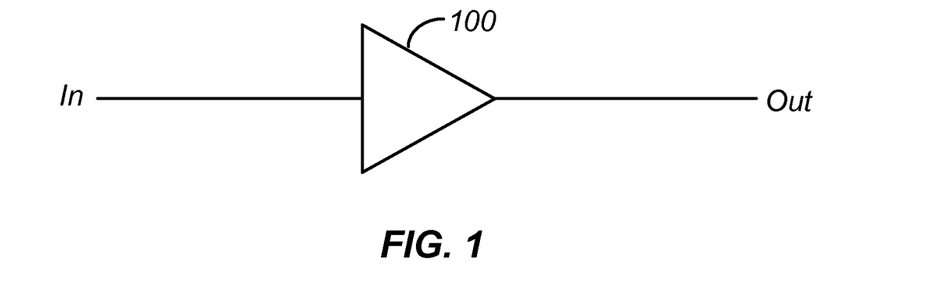
FIG. 1 shows a buffer.
Figure 2A:
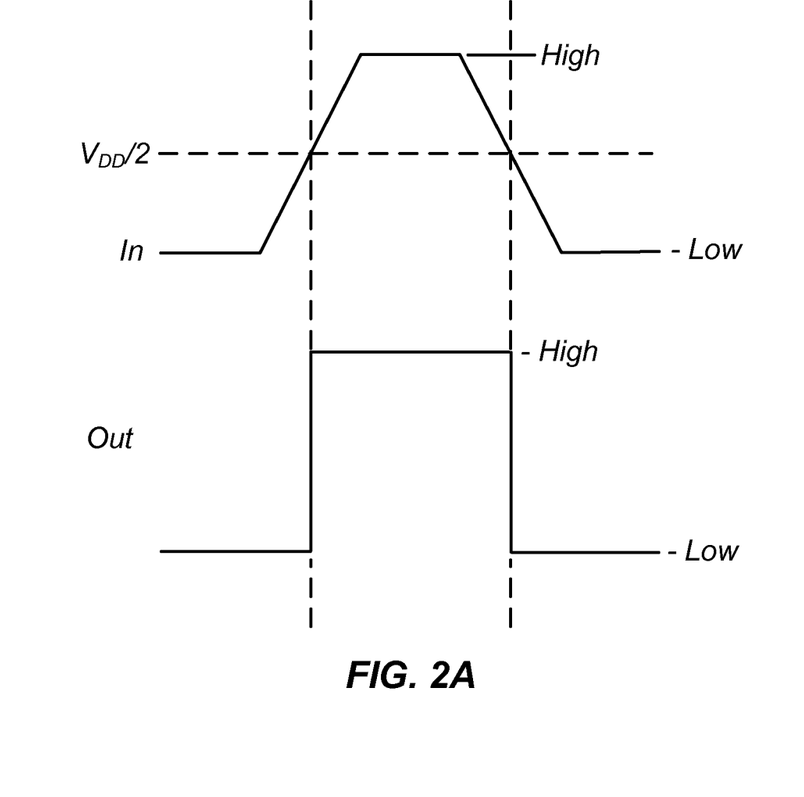
FIG. 2A shows a timing diagram depicting an example incoming signal In and the corresponding output signal Out generated as a result of passing the incoming signal In through the buffer of FIG. 1.

FIG. 1 shows a traditional buffer 100. The buffer 100 is a circuit (e.g., an input buffer) configured to receive an incoming signal In and to generate an output signal Out based on the incoming signal In. FIG. 2A shows a timing diagram depicting an example incoming signal In and the corresponding output signal Out generated as a result of passing the incoming signal In through the buffer 100 of FIG. 1. As shown, the output signal Out transitions from low (e.g., logic "0" or "zero", or ground in some implementations) to high (e.g., logic "1" or "one," or $V_{DD}$ in some implementations) when the incoming signal In rises above a threshold (e.g., generally $V_{DD}/2$) while the output signal Out transitions from high to low when the incoming signal In falls below the threshold (e.g., $V_{DD}/2$).

Figure 2B:
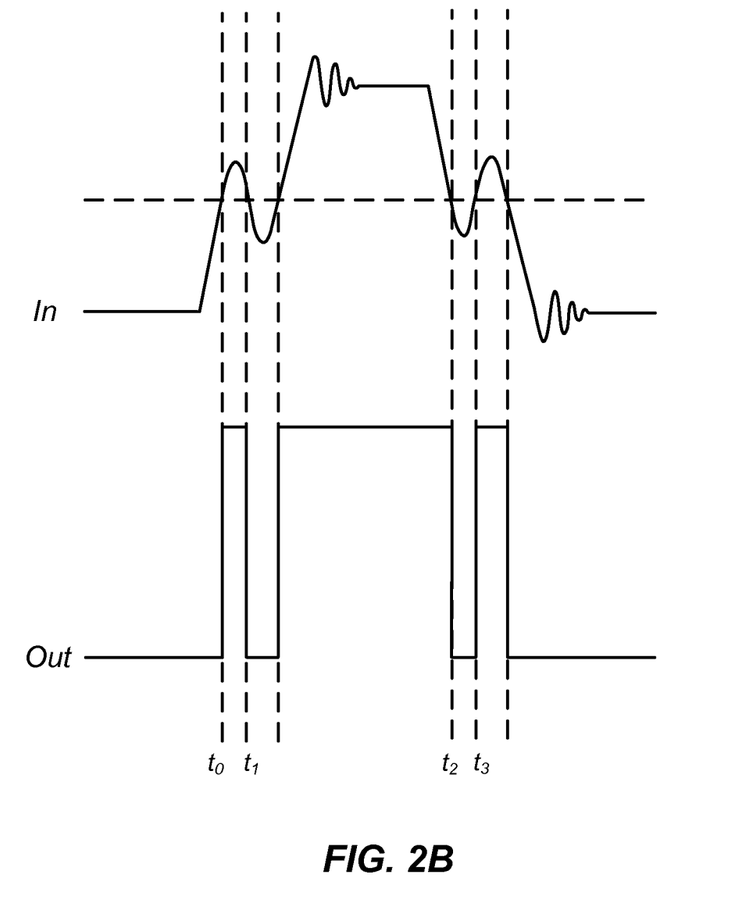
FIG. 2B shows a timing diagram depicting an example noisy incoming signal In and the corresponding output signal Out generated as a result of passing the incoming signal In through the buffer of FIG. 1.

FIG. 2B shows a timing diagram depicting an example noisy incoming signal In and the corresponding output signal Out generated as a result of passing the noisy incoming signal In through the buffer 100 of FIG. 1. FIG. 2B highlights the detrimental effects that can result from noise. For example, the noise in or on the incoming signal In can result in erroneous or unintended transitions in the output signal Out. For example, although the output signal Out transitions correctly at time $t_0$ from low to high, the output signal Out erroneously transitions from high to low at time $t_1$ as a result of noise. Similarly, although the output signal Out transitions correctly at time $t_2$ from high to low, the output signal Out erroneously transitions from low to high at $t_3$. Such resulting noise or errors in the output signal Out can then be propagated through other circuits or an entire system. As another example where the incoming signal represents data, a sampler may sample the data during a time when the output signal value is erroneously high or erroneously low. As another example where the incoming signal represents a clock signal, a receiver of the output clock signal may perform a function, such as sampling, at an unintended time, which may then result in erroneous data being read.

In some applications or implementations, the output signal Out can be configured to transition to the opposite polarity or in the opposite direction of the incoming signal In. That is, any of the circuits described herein can be configured to invert the incoming signal In; for example, to transition the output signal Out to low when the incoming signal In transitions to high and, conversely, to transition the output signal Out to high when the incoming signal In transitions to low.

Figure 3:
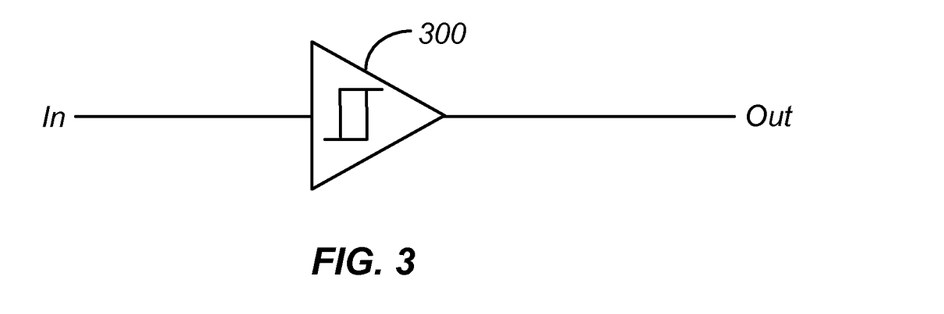
FIG. 3 shows a buffer with hysteresis.
Figure 4A:
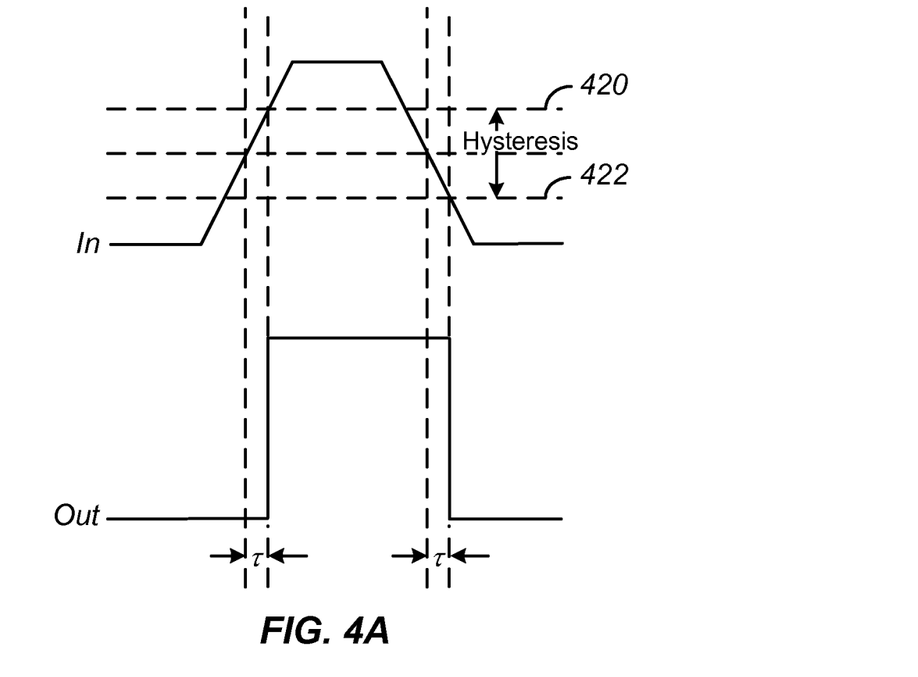
FIG. 4A shows a timing diagram depicting an example incoming signal In and the corresponding output signal Out generated as a result of passing the incoming signal In through the buffer of FIG. 3.
Figure 4B:
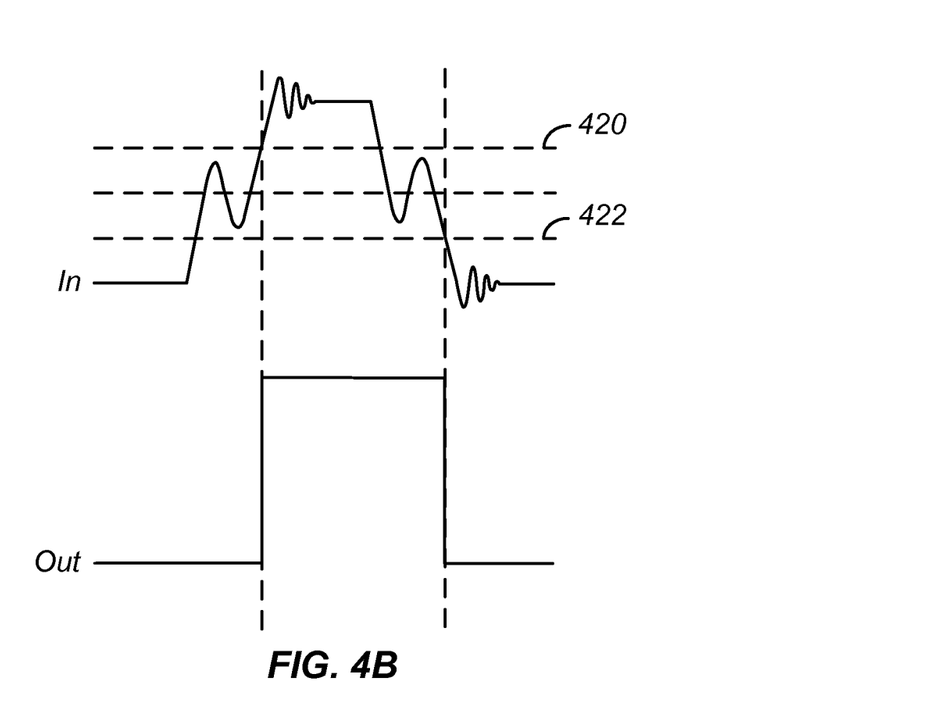
FIG. 4B shows a timing diagram depicting an example noisy incoming signal In and the corresponding output signal Out generated as a result of passing the incoming signal In through the buffer of FIG. 3.

A circuit that is characterized by or manifests hysteresis can be used to provide for some degree of noise immunity. FIG. 3 shows a buffer 300 with hysteresis. The buffer 300 is configured to receive an incoming signal In and to generate an output signal Out based on the incoming signal In. FIG. 4A shows a timing diagram depicting an example incoming signal In and the corresponding output signal Out generated as a result of passing the incoming signal In through the buffer 300 of FIG. 3. As shown, the output signal Out transitions from low to high when the incoming signal In rises above an upper threshold 420 of the hysteresis range (rather than at, e.g., $V_{DD}/2$) while the output signal Out transitions from high to low when the incoming signal In falls below a lower threshold 422 of the hysteresis range (rather than at, e.g., $V_{DD}/2$). As shown, the hysteresis introduces a delay $\tau$ between when the output signal Out would have transitioned without hysteresis (e.g., at $V_{DD}/2$) and when the output signal Out does transition because of the hysteresis (e.g, at the upper threshold 420). FIG. 4B shows a timing diagram depicting an example noisy incoming signal In and the corresponding output signal Out generated as a result of passing the noisy incoming signal In through the buffer 300 of FIG. 3. FIG. 4B highlights the noise immunity that can be achieved using hysteresis.

Figure 5A:
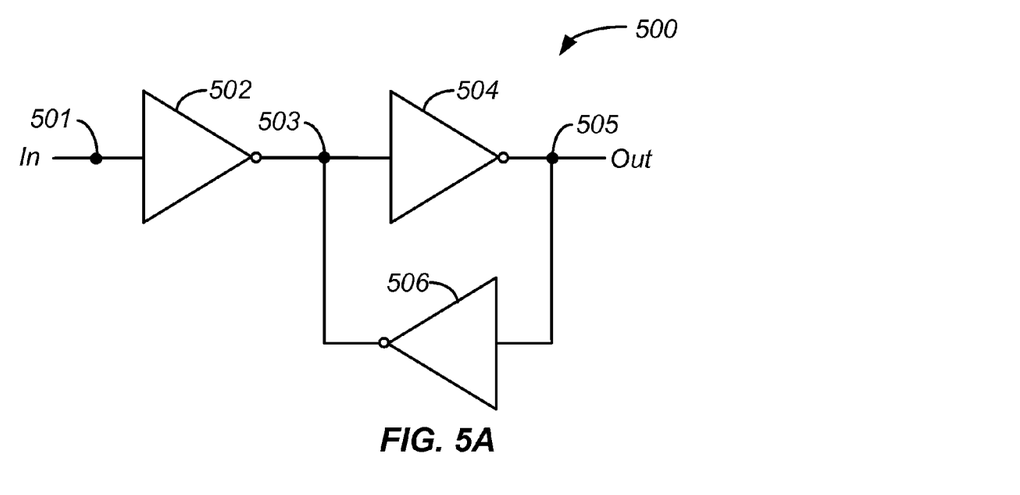
FIG. 5A shows one simple example of a buffer that exhibits hysteresis and is implemented with three inverters.
Figure 5B:
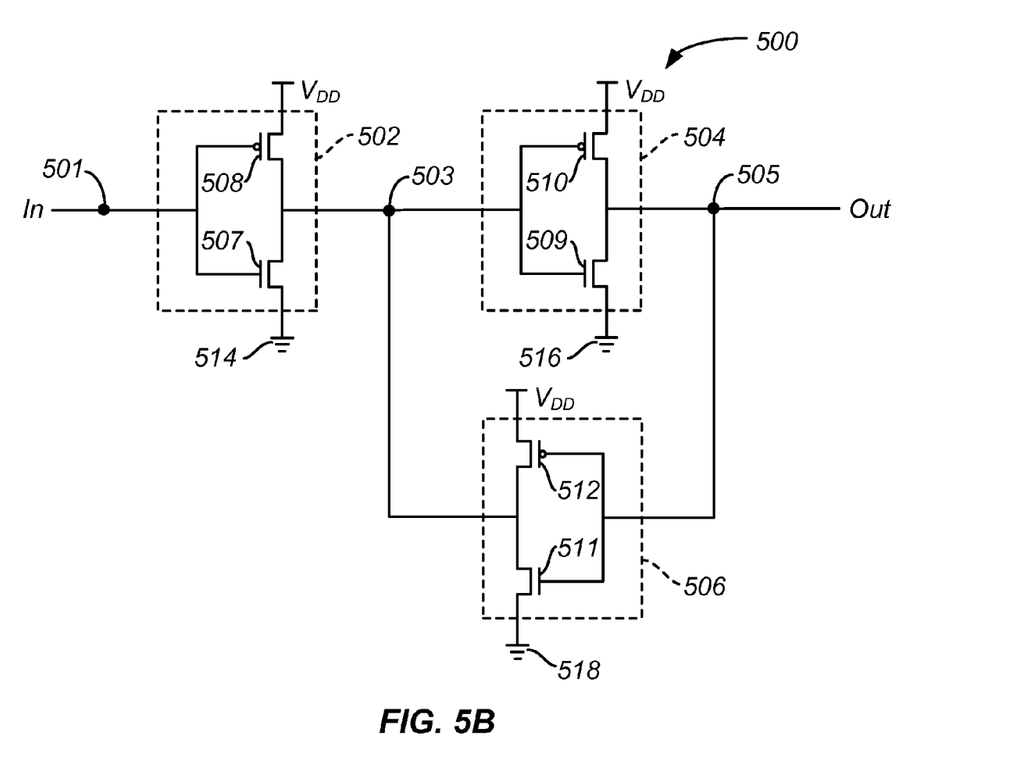
FIG. 5B shows an example of the buffer of FIG. 5A in which the strong inverters and the weak inverter are implemented with MOS transistors.

FIG. 5A shows one simple example of a buffer 500 that exhibits hysteresis and is implemented with three inverters. Because of the configuration of the inverters, the buffer 500 outputs an output signal Out that is of the same polarity as the incoming signal In (e.g., when In is low, Out is low, and when In is high, Out is high). The buffer 500 includes a first "strong" inverter 502, a second strong inverter 504, and a third "weak" inverter 506. FIG. 5B shows an example of the buffer 500 of FIG. 5A in which the strong inverters 502 and 504 and the weak inverter 506 are implemented with MOS transistors. For example, assume an initial state in which the incoming signal In on the input node 501 is low. In this state, the NMOS transistor 507 of the first strong inverter 502 is off (non-conducting) while the PMOS transistor 508 of the strong inverter 502 is on (conducting). As a result, the PMOS transistor 508 maintains the output node 503 at $V_{DD}$. The output node 503 of the first strong inverter 502 is connected with the input node of the second strong inverter 504. Because the output node 503 is high, the NMOS transistor 509 of the second strong inverter 504 is on while the PMOS transistor 510 of the second strong inverter 504 is off. As a result, the NMOS transistor 509 maintains the output node 505 of the buffer 500 at ground because the ground 516 pulls down the output node 505; that is, the output signal Out is low. The output node 505 is also connected with the input node of the weak inverter 506. Because the output signal Out is low, the NMOS transistor 511 of the weak inverter 506 is off while the PMOS transistor 512 of the weak inverter 504 is on. As a result, the PMOS transistor 512 also maintains the node 503 at high.

Now, as the incoming signal In on the input node 501 transitions from low to high, the PMOS transistor 508 of the first strong inverter 502 turns off, while the NMOS transistor 507 of the first strong inverter 502 turns on resulting in a path from the node 503 to ground 514. This has the effect of pulling the node 503 down to low. As the node 503 is pulled low, the NMOS transistor 509 of the second strong inverter 504 turns off, while the PMOS transistor 510 of the second strong inverter 504 turns on resulting in a path from $V_{DD}$ to the output node 505 of the buffer 500. This has the effect of pulling the output node 505 up to high. As the output node 505 is pulled high, the PMOS transistor 512 of the weak inverter 506 turns off, while the NMOS transistor 511 of the weak inverter 506 turns on resulting in a path from the node 503 to ground 518.

The strong inverters 502 and 504 are named as such because the PMOS and NMOS transistors of the strong inverters are, for example, larger or much larger (e.g., have much larger or wider gates) than the PMOS and NMOS transistors of the weak inverter 506. For example, in some implementations, the PMOS and NMOS transistors of the strong inverters 502 and 504 are approximately 2, 5, 10, or more times larger than the PMOS and NMOS transistors of the weak inverter 506, respectively. Because the strong inverters 502 and 504 can act faster owing to the greater current carrying capabilities of the strong inverters relative to the weak inverter 506, the PMOS and NMOS transistors of the strong inverters 502 and 504 can switch off and on faster than the PMOS and NMOS transistors of the weak inverter 506 can switch off and on. The result is that, for example, during an initial transition period as the incoming signal In is rising, the first strong inverter 502 switches faster than the weak inverter 506. Thus, although the first strong inverter 502 is pulling the node 503 down, the weak inverter 506 continues to pull the node 503 up reducing the effect of the strong inverter 502 and delaying the transition of the output signal Out on the output node 505. This builds hysteresis into the circuit, and in particular, adds an upper threshold of the hysteresis of the buffer 500. In this way, when the incoming signal In is rising, only when the upper threshold voltage is reached does the output signal Out transition to high. The second strong inverter 504 also can affect the hysteresis of the buffer 500 because it too switches faster than the weak inverter 506.

Conversely, once the buffer 500 is in a state in which the incoming signal In on the input node 501 is high, the NMOS transistor 507 of the first strong inverter 502 is on while the PMOS transistor 508 of the strong inverter 502 is off. As a result, the NMOS transistor 507 of the strong inverter 502 maintains the node 503 at low. Because the signal on the node 503 is low, the NMOS transistor 509 of the second strong inverter 504 is off, while the PMOS transistor 510 of the second strong inverter 504 is on pulling the output signal Out on the output node 505 up to high. Because the output node 505 is high, the PMOS transistor 512 of the weak inverter 506 is off, while the NMOS transistor 511 of the weak inverter 504 is on. Now, as the incoming signal In on the input node 501 transitions from high to low, the NMOS transistor 507 of the first strong inverter 502 turns off, while the PMOS transistor 508 of the first strong inverter 502 turns on resulting in a path from $V_{DD}$ to the node 503. This has the effect of pulling the node 503 up to high. As the node 503 is pulled high, the PMOS transistor 510 of the second strong inverter 504 turns off, while the NMOS transistor 509 of the second strong inverter 504 turns on resulting in a path from the output node 505 of the buffer 500 to the ground 516. This has the effect of pulling the output node 505 down to low. As the output node 505 is pulled low, the NMOS transistor 511 of the weak inverter 506 turns off, while the PMOS transistor 512 of the weak inverter 506 turns on resulting in a path from $V_{DD}$ to the node 503.

Again, because the strong inverters 502 and 504 can act faster owing to the greater current carrying capabilities of the strong inverters relative to the weak inverter 506, the PMOS and NMOS transistors of the strong inverters 502 and 504 can switch off and on faster than the PMOS and NMOS transistors of the weak inverter 506 can switch off and on. The result is that during an initial transition period as the incoming signal In is falling, the first strong inverter 502 switches faster than the weak inverter 506. Thus, although the first strong inverter 502 is pulling the node 503 up, the weak inverter 506 continues to pull the node 503 down reducing the effect of the strong inverter 502 and delaying the transition of the output signal Out on the output node 505. This again builds hysteresis into the circuit, and in particular, adds a lower threshold of the hysteresis of the buffer 500. In this way, when the incoming signal In is falling, only when the lower threshold voltage is reached does the output signal Out transition to low. Again, the second strong inverter 504 also can affect the hysteresis of the buffer 500 because it too switches faster than the weak inverter 506.

In this sense, the hysteresis of the circuit can be considered the range of voltage values between the upper and lower thresholds (e.g., thresholds 420 and 422) for which the output signal Out will not transition from its current state or value. As can be seen from this example, the wider the hysteresis, the more noise immunity can be achieved; that is, the more noise the buffer 500 can tolerate without erroneously transitioning. However, the delay $\tau$ that is introduced by the hysteresis increases as the width of the hysteresis increases. Although noise immunity is desired, the delay $\tau$ can prohibit the use of wide hysteresis in circuits used in high speed communications. Thus, there is generally a tradeoff between speed and noise immunity.

Additionally, although the buffer 500 provides a simple example for didactic purposes of describing how hysteresis can be achieved using a circuit that includes simple inverters each implemented with a pair of NMOS and PMOS transistors, there are a wide variety of other circuits with hysteresis that can be used in various implementations. For example, a Schmitt trigger is one such example. Other examples include other buffers or circuits including bi-stable circuits (e.g., latches) and circuits with feedback (e.g., positive feedback). Additionally, any of the circuits described herein can be readily adapted to work with both single-ended as well as differential (complementary) signals.

Figure 6A:
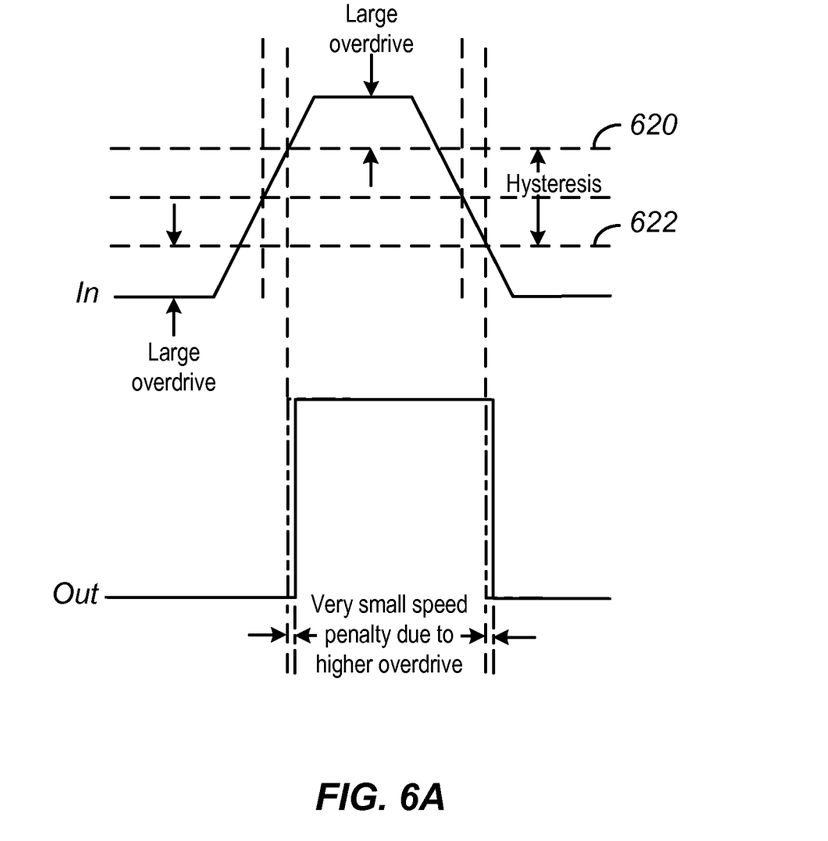
FIG. 6A shows a timing diagram depicting an example incoming signal In and the corresponding output signal Out generated as a result of passing the incoming signal In through the buffer of FIG. 3 when there is large overdrive.

Additionally, other factors such as the voltage overdrive can be critical in determining whether a buffer (e.g., buffer 300 of FIG. 3) will meet the speed requirements of the overall circuit or system. For example, FIG. 6A shows a timing diagram depicting an example incoming signal In and the corresponding output signal Out generated as a result of passing the incoming signal In through a buffer when there is large overdrive; that is, when the highs and lows of the incoming signal In are substantially rail-to-rail (e.g., 0 V to $V_{DD}$, or $-V_{DD}/2$ to $V_{DD}/2$, or some other range). The overdrive can be considered the voltage difference between the voltage value of the high logic state and the upper threshold 620 when the incoming signal In is rising or the voltage difference between the voltage value of the low logic state and the lower threshold 622 when the incoming signal In is falling. As shown in FIG. 6A, there is only a small speed penalty associated with the output transition. That is, there is an inherent delay in the buffer (e.g., in switching NMOS and PMOS transistors or otherwise activating and transitioning circuit elements such as inverters). This delay can be reduced with larger overdrive such that the transitions between logic states occur faster.

Figure 6B:
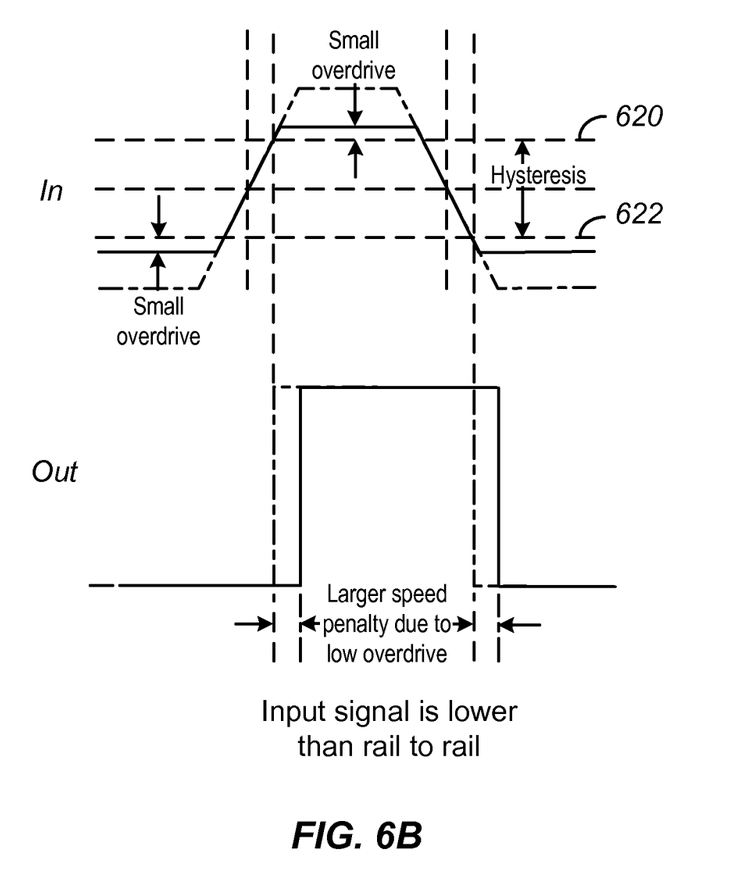
FIG. 6B shows a timing diagram depicting an example incoming signal In and the corresponding output signal Out generated as a result of passing the incoming signal In through the buffer of FIG. 3 when there is small overdrive.

FIG. 6B shows a timing diagram depicting an example incoming signal In and the corresponding output signal Out generated as a result of passing the incoming signal In through a buffer when there is small overdrive. For example, when the incoming signal In is less or much less than rail-to-rail resulting in small overdrive. As shown in FIG. 6B, there can be a significant speed penalty associated with the inherent delay of the inverters because the inherent delay is magnified or exacerbated by the lack of overdrive.

Figure 7:
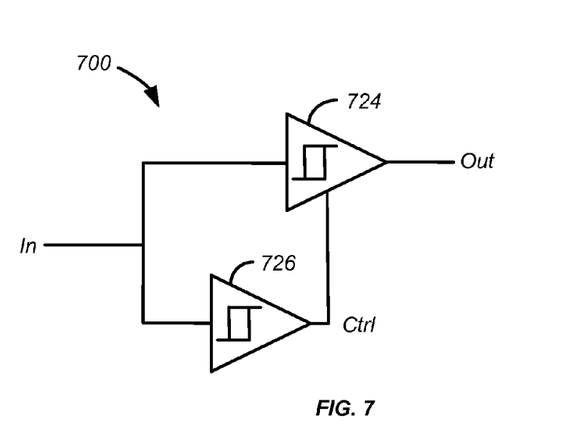
FIG. 7 shows a buffering circuit according to one example implementation.

FIG. 7 shows a buffering circuit 700 (hereinafter "circuit 700" or "buffer 700") according to one example implementation. The circuit 700 includes a first buffer 724 and a second buffer 726. For example, in some implementations, one or both of the first buffer 724 and the second buffer 726 can be the same or similar to the buffers 300 or 500 described above, or can include buffers the same or similar to the buffers 300 or 500. In some implementations, one or both of the first buffer 724 and the second buffer 726 can have one or more variations or modifications relative to the buffers 300 and 500 described above. In some implementations, one or both of the first buffer 724 and the second buffer 726 can be implemented as an inverting or non-inverting Schmitt trigger buffer or a variation thereof.

In some implementations, the first buffer 724 can be a relatively high speed buffer with hysteresis. The hysteresis of the first buffer 724 can be changed dynamically during operation of the buffer 700. For example, the first buffer 724 can exhibit a hysteresis range with a dynamic lower threshold and a dynamic upper threshold. The first buffer can be configured to transition from a first hysteresis state in which the dynamic lower threshold has a first lower value and the dynamic upper threshold has a first upper value, to a second hysteresis state in which the dynamic lower threshold has a second lower value and the dynamic upper threshold has a second upper value, and vice versa. The first and second lower threshold values and the first and second upper threshold values can vary according to application and implementation. For example, the hysteresis range of the first buffer 724 while in one or both of the first and second hysteresis states can be selected or tuned to achieve timing, speed, or other requirements that may vary from application to application and implementation to implementation. In some implementations, the first and second lower threshold values are offset from one another by a voltage offset $\Delta V_L$ while the first and second upper threshold values are offset from one another by a voltage offset $\Delta V_U$. In some implementations, the magnitude of the hysteresis range of the first buffer 724 is the same in both the first and the second hysteresis states. In such implementations, the voltage offset $\Delta V_L$ is equal to the voltage offset $\Delta V_U$. In some other implementations, the voltage offset $\Delta V_L$ can be unequal to the voltage offset $\Delta V_U$ such that the magnitude of the hysteresis range of the first buffer 724 is different in the first and the second hysteresis states.

The hysteresis range of the second buffer 726 can be fixed (static). In some implementations, the hysteresis range of the first buffer 724 is less than the hysteresis range of the second buffer 726. Thus, in some implementations, the first buffer 724 can be considered relatively fast enabling the first buffer to meet the speed requirements of high speed systems, but may have relatively less noise immunity. In contrast, the second buffer 726 has a relatively wide hysteresis range. In some implementations, the lower threshold of the second buffer 726 is less than (or more negative than) both the first and the second lower thresholds of the first buffer 724. In some implementations, the upper threshold of the second buffer 726 is greater than (or more positive than) both the first and the second upper thresholds of the first buffer 724. In some other implementations, the lower threshold of the second buffer 726 is equal to the first lower threshold of the first buffer 724 or has a value between the first and the second lower thresholds of the first buffer 724. In some implementations, the upper threshold of the second buffer 726 is equal to the second upper threshold of the first buffer 724 or has a value between the first and the second upper thresholds of the first buffer 724. In some implementations, the second buffer 726 can be any buffer with a relatively wide hysteresis range. For example, in some example implementations, the second buffer 726 has a hysteresis range that is selected according to the application and especially according to the level of noise immunity desired in meeting the requirements of the particular application. Thus, in some implementations, the second buffer 726 can be considered as providing a high degree of noise immunity while being relatively slower as compared with the first buffer 724.

Figure 8:
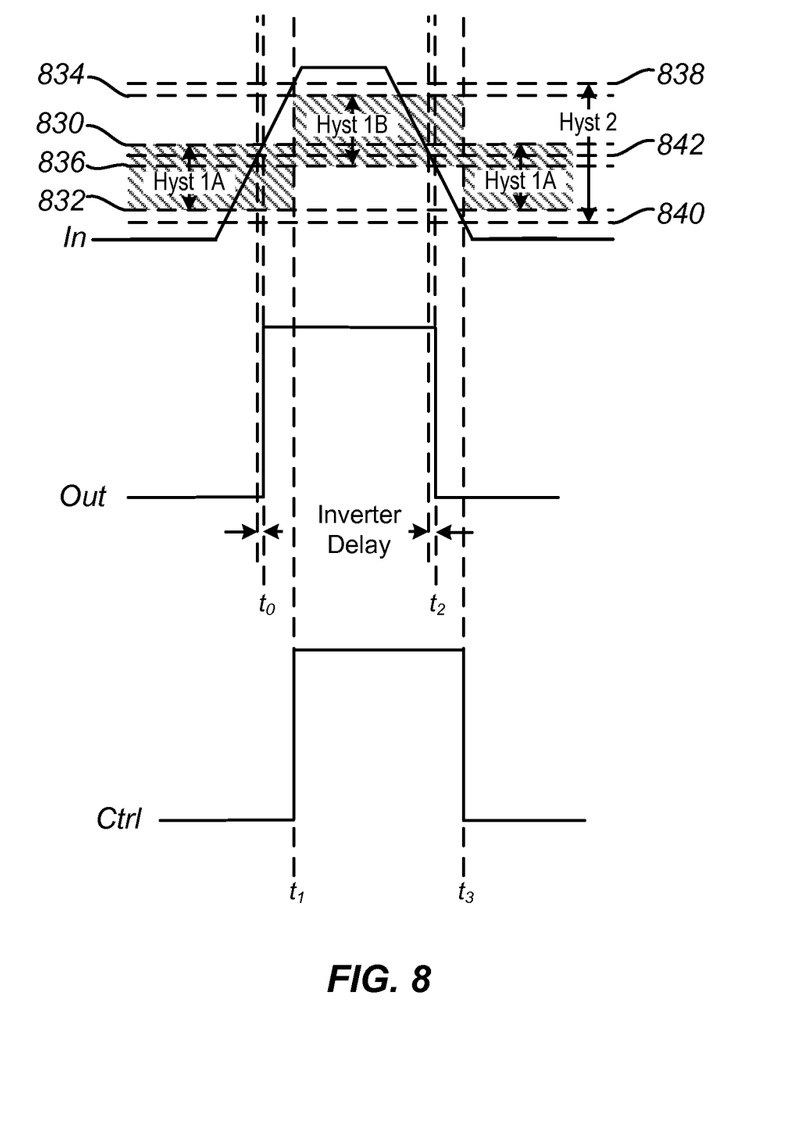
FIG. 8 shows a timing diagram depicting an example of an incoming signal In and the corresponding output signals Ctrl and Out generated as a result of passing the incoming signal In through the circuit of FIG. 7

In the implementation depicted in FIG. 7, both the first buffer 724 and the second buffer 726 are configured to receive an incoming signal In. The first buffer 724 is further configured to generate an output signal Out while the second buffer 726 is further configured to generate a control signal Ctrl. FIG. 8 shows a timing diagram depicting an example of an incoming signal In and the corresponding signals Ctrl and Out generated as a result of passing the incoming signal In through the circuit 700 of FIG. 7. As shown, in this implementation, the first buffer is in the first hysteresis state (shown shaded as "Hyst 1A") in which the dynamic upper threshold has a first upper threshold value 830 and in which the dynamic lower threshold has a first lower threshold value 832. When the first buffer 724 is in the first hysteresis state, the output signal Out will transition from low to high when a rising incoming signal In rises above the first upper threshold value 830 of the first buffer 724 at $t_0$. After the transition at $t_0$, the first buffer 724 is still in the first hysteresis state, and while in the first hysteresis state, the output signal Out will remain in the high state so long as the incoming signal In remains above the first lower threshold value 832.

When the incoming signal In rises above the upper threshold 838 of the second buffer 726 at $t_1$, the output of the second buffer 726—the control signal Ctrl—transitions from low to high. As shown in FIG. 7, the control signal Ctrl is an input to the first buffer 724. In response to the control signal Ctrl transitioning to the high state, the first buffer 724 transitions from the first hysteresis state to the second hysteresis state (shown shaded as "Hyst 1B") in which the dynamic upper threshold has a second upper threshold value 834 and in which the dynamic lower threshold has a second lower threshold value 836. When the first buffer 724 is in the second hysteresis state, the output signal Out transitions from high to low when a falling incoming signal In falls below the second lower threshold value 836 of the first buffer 724 at $t_2$. After the transition at $t_2$, the first buffer 724 is still in the second hysteresis state, and while in the second hysteresis state, the output signal Out will remain in the low state so long as the incoming signal In remains below the second upper threshold value 834. When the incoming signal In falls below the lower threshold 840 of the second buffer 726 at $t_3$, the control signal Ctrl transitions from high to low. In response to the control signal Ctrl transitioning to the low state, the first buffer 724 transitions from the second hysteresis state back to the first hysteresis state.

As shown in FIG. 8, in some implementations, the hysteresis range of the second buffer 726 is symmetric about a central value 842 (e.g., 0V or $V_{DD}/2$ or some other middle value). In contrast, the first hysteresis range can be asymmetric about the central value while in either the first hysteresis state or the second hysteresis state. For example, as shown in FIG. 8, while in the first hysteresis state the hysteresis range of the first buffer 724 can be skewed to a relatively more negative set of upper and lower threshold values 830 and 832. In some implementations, the first upper threshold value 830 can have a value more positive than or equal to the central value 842 but proximate the central value 842 relative to the value of the upper threshold 838 of the hysteresis range of the second buffer 726. In some implementations, the first lower threshold value 832 can have a value substantially more negative than the central value 842.

While in the second hysteresis state the hysteresis range of the first buffer 724 can be skewed to a relatively more positive set of upper and lower threshold values 834 and 836. In some implementations, the second upper threshold value 834 can have a value substantially more positive than the central value 842. In some implementations, the second lower threshold value 836 can have a value more negative than or equal to the central value 842 but proximate the central value 842 relative to the value of the lower threshold 840 of the hysteresis range of the second buffer 726.

In some example implementations, the offset between the first upper threshold value 830 of the first buffer 724 and the central value 842 is less than a value that is in the range of approximately 10% to approximately 50% of the offset between the value of the upper threshold 838 of the second hysteresis range and the central value 842. In some implementations, the first lower threshold value 832 of the first buffer 724 is approximately equal to the value of the lower threshold 840 of the hysteresis range of the second buffer 726. In some example implementations, the offset between the second lower threshold value 836 of the first buffer 724 and the central value 842 is less than a value that is in the range of approximately 10% to approximately 50% of the offset between the value of the lower threshold 840 of the second hysteresis range and the central value 842. In some implementations, the second upper threshold value 834 of the first buffer 724 is approximately equal to the value of the upper threshold 838 of the hysteresis range of the second buffer 726. In some implementations, the value of the upper threshold 838 of the hysteresis range of the second buffer 726 is more positive than the second upper threshold value 834 of the first buffer 724. In some implementations, the value of the lower threshold 840 of the hysteresis range of the second buffer 726 is more negative than the first lower threshold value 832 of the first buffer 724.

In this manner, the circuit 700 achieves the speed of a narrow hysteresis range—from the first buffer 724—while getting the benefit of the high degree of noise immunity of the wide hysteresis buffer 726. That is, because the first upper threshold value 830 is proximate to or equal to the central value 842, the first buffer 724 is configured to transition the output signal Out from low to high with high speed. Similarly, because the second lower threshold value 836 is proximate to or equal to the central value 842, the first buffer 724 is configured to transition the output signal Out from high to low with high speed. It should also be appreciated that the circuit 700 also can be configured such that the output signal Out transitions from high to low when a rising incoming signal In rises above the first upper threshold value 830 of the first buffer 724 at $t_0$. In such implementations, the circuit 700 also can be configured such that the output signal Out transitions from low to high when a falling incoming signal In falls below the second lower threshold value 836 of the first buffer 724 at $t_2$. For example, in such implementations, one or both of the first buffer 724 and the second buffer 726 can be configured to invert the incoming signal In.

Figure 9:
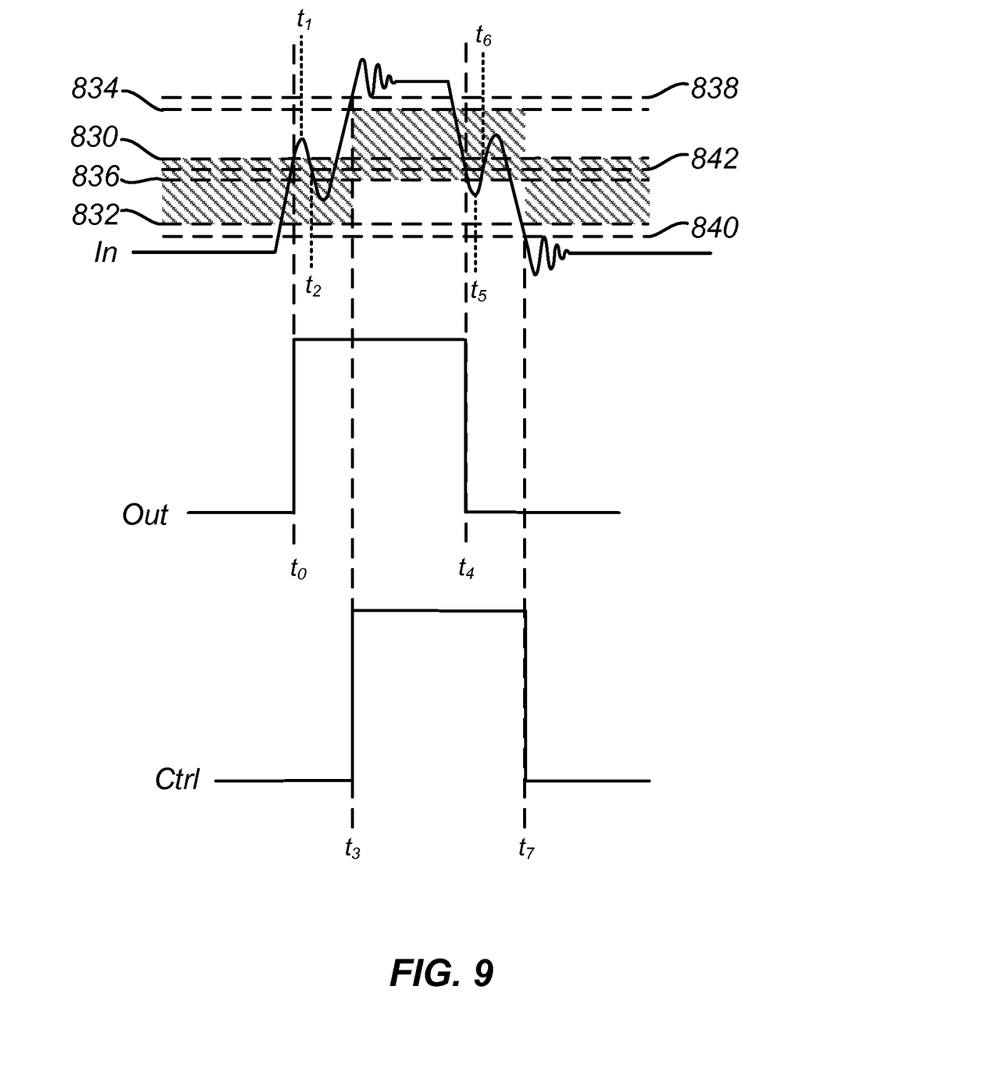
FIG. 9 shows a timing diagram depicting an example noisy incoming signal In and the corresponding output signals Ctrl and Out generated as a result of passing the incoming signal In through the circuit of FIG. 7.

FIG. 9 shows a timing diagram depicting an example noisy incoming signal In and the corresponding signals Ctrl and Out generated as a result of passing the noisy incoming signal In through the circuit of FIG. 7 (For clarity of illustration, the timing diagram of FIG. 9 does not show the speed penalty associated with the inherent delay of the inverters). FIG. 9 illustrates the noise immunity that can be achieved using the arrangement of circuit 700. Because of the asymmetric hysteresis of the first buffer 724, the time delay associated with hysteresis is small or minimal and, additionally, the inherent delay in the buffer 724 is reduced because of the resulting large overdrive. As shown in FIG. 9, because the first buffer 724 is initially in the first hysteresis state, the output signal Out of the first buffer 724 transitions to high after the incoming signal In crosses the first upper threshold value 830 of the first buffer 724 at $t_0$. Because the first buffer 724 is in the first hysteresis state, even when the incoming signal In falls at $t_1$ and goes below the central value 842 at $t_2$, the output signal Out remains high.

When the incoming signal In rises above the upper threshold 838 of the hysteresis range of the second buffer 726 at $t_3$, the control signal Ctrl transitions from low to high resulting in a transition in the first buffer 724 from the first hysteresis state to the second hysteresis state. While the first buffer 724 is in the second hysteresis state, when the incoming signal In falls below the second lower threshold value 836 at $t_4$, the output signal Out of the first buffer 724 transitions to low. Because the first buffer 724 is in the second hysteresis state, even when the incoming signal In rises at $t_5$ and goes above the central value 842 at $t_6$, the output signal Out remains at low. When the incoming signal In falls below the lower threshold 840 of the hysteresis range of the second buffer 726 at $t_7$, the control signal Ctrl transitions from high to low resulting in a transition in the first buffer 724 from the second hysteresis state to the first hysteresis state.

Figure 10:
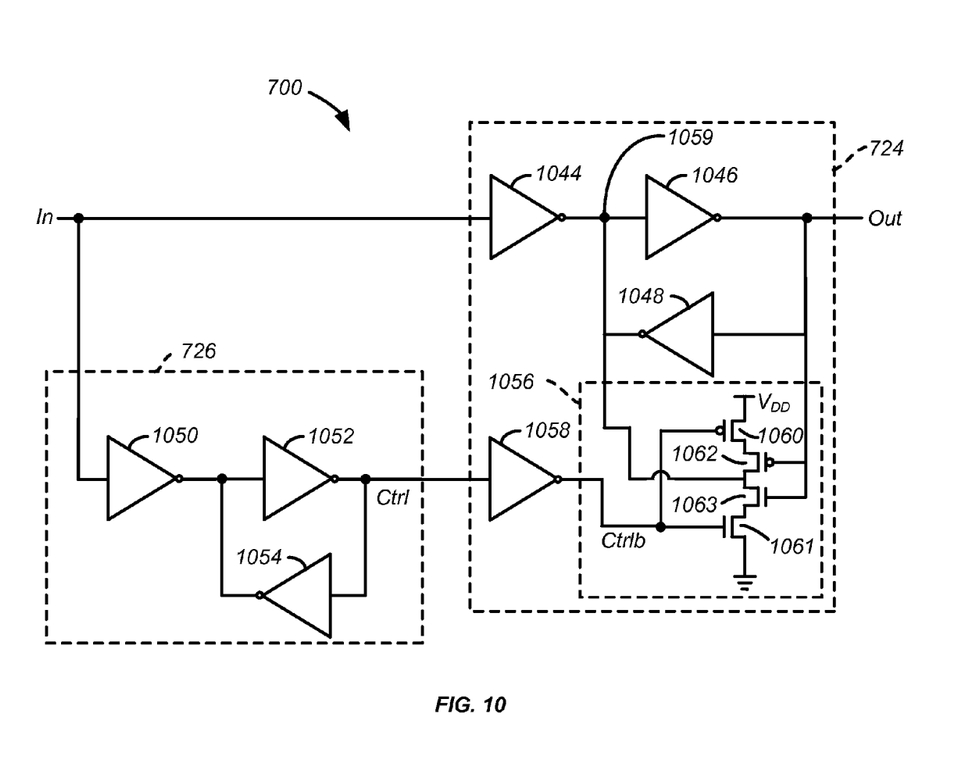
FIG. 10 shows one specific example implementation of the buffering circuit of FIG. 7.

FIG. 10 shows one specific example implementation of the buffering circuit 700 of FIG. 7. In the implementation shown in FIG. 10, like the buffer implementation of FIG. 5A, each of the first and second buffers 724 and 726 includes three inverters. For example, the first buffer 724 can include two strong inverters 1044 and 1046 and a weak inverter 1048 arranged similar to the inverters in the buffer 500 shown in FIG. 5A. Similarly, the second buffer 726 can include two strong inverters 1050 and 1052 and a weak inverter 1054 arranged similar to the inverters in the buffer 500 shown in FIG. 5A. The first buffer 724 also includes or is connected to a control circuit 1056. In the illustrated implementation, the first buffer 724 further includes an inverter 1058 that receives the control signal Ctrl from the second buffer 726 and outputs an inverted control signal Ctrlb.

The control circuit 1056 receives the inverted control signal Ctrlb from the inverter 1058. The inverted control signal Ctrlb is input to PMOS transistor 1060 and NMOS transistor 1061. The PMOS transistor 1060 controls the path from the positive power supply (e.g., $V_{DD}$) to a second PMOS transistor 1062. The NMOS transistor 1061 controls the path from ground (or from a negative supply voltage $V_{SS}$) to a second NMOS transistor 1063. The drains of both the second PMOS transistor 1062 and the second NMOS transistor 1063 are electrically connected to node 1059, which is electrically connected to the output of the inverter 1044. When Ctrl is low, Ctrlb is high; and when Ctrlb is high, the first PMOS transistor 1060 is off. When the first PMOS transistor 1060 is off, the second PMOS transistor 1062 is off regardless of the state of the output signal Out. Additionally, because Ctrlb is high, the first NMOS transistor 1061 is on. When the first NMOS transistor 1061 is on, the second NMOS transistor 1063 turns on when the output signal Out is high.

When In is low, the node 1059 is high and Out is low. Because Out is low, the second NMOS transistor 1063 is off. Because Ctrl is still low (Ctrlb is still high), the PMOS transistor 1060 is still off, and thus, the second PMOS transistor 1062 is off despite Out being low. In this state, the weak inverter 1048 and the strong inverter 1044 generate hysteresis for the first hysteresis state in preparation for a transition of In from low to high. In implementations in which the weak inverter 1048 is very weak relative to the strong inverter 1044, the first upper threshold 830 of the first buffer 724 will be close to the middle value 842. Conversely, when In is high, the node 1059 is low and Out is high. Because Out is high, the second PMOS transistor 1062 is off Because Cltr is still low (Ctrlb is still high), the first NMOS transistor 1061 is on. Additionally, because the first NMOS transistor 1061 is on and because Out is high, the second NMOS transistor 1063 is also on. In this state, when In falls, the strong inverter 1044 will pull up node 1059 while both the weak inverter 1048 and the second NMOS transistor 1063 (through the first NMOS transistor 1061) will pull down node 1059. The addition of the second NMOS transistor 1063 causes the first lower threshold 832 to be much lower than the middle value 842. In this way, the control circuit 1056 generates the asymmetrical first hysteresis state for the first buffer 724.

When Ctrl is high, Ctrlb is low; and when Ctrlb is low, the first NMOS transistor 1061 is off. When the first NMOS transistor 1061 is off, the second NMOS transistor 1063 is off regardless of the state of the output signal Out. Additionally, because Ctrlb is low, the first PMOS transistor 1060 is on. When the first PMOS transistor 1060 is on, the second PMOS transistor 1062 turns on when the output signal Out is low. When In is high, the node 1059 is low and Out is high. Because Out is high, the second PMOS transistor 1062 is off. Because Ctrl is still high (Ctrlb is still low), the NMOS transistor 1061 is still off, and thus, the second NMOS transistor 1063 is off despite Out being high. In this state, the weak inverter 1048 and the strong inverter 1044 generate hysteresis for the second hysteresis state in preparation for a transition of In from high to low. In implementations in which the weak inverter 1048 is very weak relative to the strong inverter 1044, the second lower threshold 836 of the first buffer 724 will be close to the middle value 842. Conversely, when In is low, the node 1059 is high and Out is low. Because Out is low, the second NMOS transistor 1063 is off. Because Cltr is still high (Ctrlb is still low), the first PMOS transistor 1060 is on. Additionally, because the first PMOS transistor 1060 is on and because Out is low, the second PMOS transistor 1062 is also on. In this state, when In rises, the strong inverter 1044 will pull down node 1059 while both the weak inverter 1048 and the second PMOS transistor 1062 (through the first PMOS transistor 1060) will pull up node 1059. The addition of the second PMOS transistor 1062 causes the second upper threshold 834 to be much higher than the middle value 842. In this way, the control circuit 1056 generates the asymmetrical second hysteresis state for the first buffer 724.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A circuit comprising:
a first buffer configured to receive an incoming signal and a control signal and to generate an output signal based on the incoming signal, the first buffer exhibiting a first hysteresis range while configured in a first hysteresis state, the first buffer exhibiting a second hysteresis range while configured in a second hysteresis state, the first buffer being configured to transition from the first hysteresis state to the second hysteresis state and vice versa in response to the control signal; and
a second buffer configured to receive the incoming signal and to generate the control signal based on the incoming signal, the second buffer exhibiting a third hysteresis range with a lower threshold more negative than at least a lower threshold of the second hysteresis range, and an upper threshold more positive than at least an upper threshold of the first hysteresis range.

2. The circuit of claim 1, wherein the third hysteresis range is symmetric about a central value.

3. The circuit of claim 2, wherein neither the first hysteresis range nor the second hysteresis range is symmetric about the central value.

4. The circuit of claim 3, wherein while in the first hysteresis state the first hysteresis range is skewed to a relatively more negative set of upper and lower threshold values and while in the second hysteresis state the second hysteresis range is skewed to a relatively more positive set of upper and lower threshold values.

5. The circuit of claim 1, wherein, from a state in which the incoming signal is low, the output signal is in a first logic state, the control signal is in a second logic state, and the first buffer is in the first hysteresis state:
when the incoming signal rises above the upper threshold of the first buffer, the first buffer transitions the output signal to a third logic state; and
when the incoming signal rises above the upper threshold of the second buffer, the second buffer transitions the control signal to a fourth logic state, and the first buffer transitions from the first hysteresis state to the second hysteresis state based on the fourth logic state.

6. The circuit of claim 5, wherein, from a state in which the incoming signal is high, the output signal is in the third logic state, the control signal is in the fourth logic state, and the first buffer is in the second hysteresis state:
when the incoming signal falls below the lower threshold of the first buffer, the first buffer transitions the output signal to the first logic state; and
when the incoming signal falls below the lower threshold of the second buffer, the second buffer transitions the control signal to the second logic state, and the first buffer transitions from the second hysteresis state to the first hysteresis state based on the second logic state.

7. A circuit comprising:
a first buffer configured to receive an incoming signal and to generate a first output signal based on the incoming signal, the first buffer exhibiting a first dynamic hysteresis range with a dynamic lower threshold and a dynamic upper threshold, the first buffer being configured to transition from a first hysteresis state in which the dynamic lower threshold has a first lower value and the dynamic upper threshold has a first upper value, to a second hysteresis state in which the dynamic lower threshold has a second lower value and the dynamic upper threshold has a second upper value; and
a second buffer configured to receive the incoming signal and to generate a second output signal based on the incoming signal, the second buffer exhibiting a second hysteresis range with a lower threshold and an upper threshold; and wherein the second buffer is configured to change a logic state of the second output signal when the incoming signal crosses the lower threshold or the upper threshold of the second hysteresis;

the first buffer is configured to transition from the first hysteresis state to the second hysteresis state or from the second hysteresis state to the first hysteresis state in response to the logic state of the second output signal; and the first buffer is configured to change a logic state of the first output signal when the incoming signal crosses the dynamic lower threshold or the dynamic upper threshold of the first hysteresis.

8. The circuit of claim 7, wherein the value of the lower threshold and the value of the upper threshold of the second hysteresis range are both static during operation of the second buffer.

9. The circuit of claim 7, wherein the second hysteresis range is symmetric about a central value.

10. The circuit of claim 9, wherein the first hysteresis range is not symmetric about the central value while in either the first hysteresis state or the second hysteresis state.

11. The circuit of claim 10, wherein while in the first hysteresis state the first dynamic hysteresis range is skewed to a relatively more negative set of upper and lower threshold values and while in the second hysteresis state the first dynamic hysteresis range is skewed to a relatively more positive set of upper and lower threshold values.

12. The circuit of claim 11, wherein:

when the first buffer is in the first hysteresis state:

the first upper value of the dynamic upper threshold has a value more positive than or equal to the central value but proximate the central value relative to the value of the upper threshold of the second hysteresis range; and the first lower value of the dynamic lower threshold has a value substantially more negative than the central value; and when the first buffer is in the second hysteresis state:

the second upper value of the dynamic upper threshold has a value substantially more positive than the central value; and the second lower value of the dynamic lower threshold has a value less than or equal to the central value but proximate the central value relative to the value of the lower threshold of the second hysteresis range.

13. The circuit of claim 12, wherein the offset between the first upper value of the dynamic upper threshold and the central value is less than a value that is in the range of approximately 10% to approximately 50% of the offset between the value of the upper threshold of the second hysteresis range and the central value.

14. The circuit of claim 13, wherein the first lower value of the dynamic lower threshold is approximately equal to the value of the lower threshold of the second hysteresis range.

15. The circuit of claim 12, wherein the offset between the second lower value of the dynamic lower threshold and the central value is less than a value that is in the range of approximately 10% to approximately 50% of the offset between the value of the lower threshold of the second hysteresis range and the central value.

16. The circuit of claim 15, wherein the second upper value of the dynamic upper threshold is approximately equal to the value of the upper threshold of the second hysteresis range.

17. The circuit of claim 12, wherein the value of the upper threshold of the second hysteresis range is more positive than the second upper value of the dynamic upper threshold of the first buffer, and wherein the value of the lower threshold of the second hysteresis range is more negative than the first lower value of the dynamic lower threshold of the first buffer.

18. The circuit of claim 12, wherein, from a state in which the incoming signal is low, the first output signal is in a first logic state, the second output signal is in a second logic state, and the first buffer is in the first hysteresis state:

when the incoming signal rises above the dynamic upper threshold of the first buffer, the first buffer transitions the first output signal to a third logic state; and when the incoming signal rises above the upper threshold of the second buffer, the second buffer transitions the second output signal to a fourth logic state, and the first buffer transitions from the first hysteresis state to the second hysteresis state based on the fourth logic state.

19. The circuit of claim 18, wherein, from a state in which the incoming signal is high, the first output signal is in the third logic state, the second output signal is in the fourth logic state, and the first buffer is in the second hysteresis state:

when the incoming signal falls below the dynamic lower threshold of the first buffer, the first buffer transitions the first output signal to the first logic state; and when the incoming signal falls below the lower threshold of the second buffer, the second buffer transitions the second output signal to the second logic state, and the first buffer transitions from the second hysteresis state to the first hysteresis state based on the second logic state.

20. A circuit comprising:

a first buffer configured to receive an incoming signal and to generate a first output signal based on the incoming signal, the first buffer exhibiting a first dynamic hysteresis range with a dynamic lower threshold and a dynamic upper threshold, the first buffer being configured to transition from a first hysteresis state in which the dynamic lower threshold has a first lower value and the dynamic upper threshold has a first upper value, to a second hysteresis state in which the dynamic lower threshold has a second lower value and the dynamic upper threshold has a second upper value; and a second buffer configured to receive the incoming signal and to generate a second output signal based on the incoming signal, the second buffer exhibiting a second hysteresis range with a lower threshold and an upper threshold; and wherein from a state in which the incoming signal is low, the first output signal is in a first logic state, the second output signal is in a second logic state, and the first buffer is in the first hysteresis state:

when the incoming signal rises above the dynamic upper threshold of the first buffer, the first buffer transitions the first output signal to a third logic state; and when the incoming signal rises above the upper threshold of the second buffer, the second buffer transitions the second output signal to a fourth logic state, and the first buffer transitions from the first hysteresis state to the second hysteresis state based on the fourth logic state; and from a state in which the incoming signal is high, the first output signal is in the third logic state, the second output signal is in the fourth logic state, and the first buffer is in the second hysteresis state:
when the incoming signal falls below the dynamic lower threshold of the first buffer, the first buffer transitions the first output signal to the first logic state; and
when the incoming signal falls below the lower threshold of the second buffer, the second buffer transitions the second output signal to the second logic state, and the first buffer transitions from the second hysteresis state to the first hysteresis state based on the second logic state.

\* \* \* \* \*